US006941528B2

(12) United States Patent
Allen et al.

(10) Patent No.: US 6,941,528 B2
(45) Date of Patent: Sep. 6, 2005

(54) USE OF A LAYOUT-OPTIMIZATION TOOL TO INCREASE THE YIELD AND RELIABILITY OF VLSI DESIGNS

(75) Inventors: Robert J. Allen, Jericho, VT (US); Jason D. Hibbeler, Williston, VT (US); Gustavo E. Tellez, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 131 days.

(21) Appl. No.: 10/604,962

(22) Filed: Aug. 28, 2003

(65) Prior Publication Data

US 2005/0050500 A1 Mar. 3, 2005

(51) Int. Cl.[7] ............................................... G06F 17/50
(52) U.S. Cl. ............................................. 716/2; 716/11
(58) Field of Search .............................. 716/2, 5, 8–14

(56) References Cited

U.S. PATENT DOCUMENTS

| | | | |
|---|---|---|---|
| 4,831,725 A | | 5/1989 | Dunham et al. |
| 5,459,690 A | | 10/1995 | Rieger et al. |
| 5,796,274 A | | 8/1998 | Willis et al. |
| 5,798,937 A | * | 8/1998 | Bracha et al. ................. 716/9 |
| 6,026,224 A | | 2/2000 | Darden et al. |
| 6,189,132 B1 | | 2/2001 | Heng et al. |
| 6,484,301 B1 | | 11/2002 | Burden |
| 6,556,658 B2 | | 4/2003 | Brennan |
| 6,715,133 B2 | * | 3/2004 | Brennan ......................... 716/2 |
| 6,804,808 B2 | * | 10/2004 | Li et al. ......................... 716/5 |
| 6,816,998 B2 | * | 11/2004 | Li ................................. 716/5 |
| 2004/0255258 A1 | * | 12/2004 | Li ............................. 716/608 |

OTHER PUBLICATIONS

Jaidormrong et al., "Software Tool Development for Marker Operations in Textile Inductry," IEEE, Jul. 16–20, 2003, pp. 503–508.*

* cited by examiner

*Primary Examiner*—Vuthe Siek
(74) *Attorney, Agent, or Firm*—McGinn & Gibb, PLLC; Richard M. Kotulak, Esq.

(57) ABSTRACT

The invention provides a method and structure for optimizing placement of redundant vias within an integrated circuit design. The invention first locates target vias by determining which vias do not have a redundant via. Then, the invention draws marker shapes on or adjacent to the target vias. The marker shapes are only drawn in a horizontal or vertical direction from each of the target vias. The invention simultaneously expands all of the marker shapes in the first direction to a predetermined length or until the marker shapes reach the limits of a ground rule. During the expanding, different marker shapes will be expanded to different lengths. The invention determines which of the marker shapes were expanded sufficiently to form a valid redundant via to produce a first set of potential redundant vias and the invention eliminates marker shapes that could not be expanded sufficiently to form a valid redundant via.

27 Claims, 7 Drawing Sheets

USE OF A LAYOUT-OPTIMIZATION TOOL TO INCREASE THE YIELD AND RELIABILITY OF VLSI DESIGNS

BACKGROUND OF INVENTION

1. Field of the Invention

The present invention generally relates to increasing the yield of integrated circuit devices and more particularly to an improved methodology for forming redundant vias and increasing spacing between vias.

2. Description of the Related Art

Due to the nature of the CMOS manufacturing process, it is sometimes desirable to modify a ground-rule-correct VLSI design for the purpose of increasing reliability or manufacturing yield. One way to achieve this is to add redundancy to contacts or vias, and in certain circumstances, it is beneficial to increase the spacing between vias that are on the same level or are on different levels. The advantages of automating the insertion of redundant contacts or the separating of vias are self-evident; VLSI designs can contain millions of vias, and any attempt to do such layout modification by hand would be prohibitively expensive. In addition, by automating these activities, the results can be discarded and then easily regenerated if the layout changes or the manufacturing ground rules change.

SUMMARY OF INVENTION

The invention provides a method for optimizing placement of redundant vias within an integrated circuit design. The invention first locates target vias by determining which vias do not have a redundant via. Then, the invention draws marker shapes on, or adjacent to, the target vias. The marker shapes are only drawn in a horizontal or vertical direction from each of the target vias. Next, the invention uses an optimizer to simultaneously expand all of the marker shapes in the first direction to a predetermined length or until the marker shapes reach the limits of a ground rule. During the expanding, different marker shapes will be expanded to different lengths. The invention determines which of the marker shapes were expanded sufficiently to form a valid redundant via to produce a first set of potential redundant vias and the invention eliminates marker shapes that could not be expanded sufficiently to form a valid redundant via. The invention repeats the foregoing processing in the direction perpendicular to the first, again using an optimizer to determine which marker shapes from this second pass of potential redundant vias produce the highest number of redundant vias. The invention then adds the redundant vias to the integrated circuit design, according to output produced by the optimizer.

The invention uses a shapes-processing program to locate the target vias, draw the marker shapes and determine whether the marker shapes were expanded sufficiently to qualify as valid vias. A minimum perturbation layout-migration tool based on augmented ground rules is used to expand the marker shapes. These augmented ground rules direct the layout-migration tool how to modify the marker shapes to reveal when space is available to continue the expanding of the marker shapes.

The invention eliminates stacked vias using a similar technique. Instead of just adding a redundant via, the invention adds a redundant via and then removes the original via. In this way, vias on level Vx and Vx+1 will then no longer overlay each other. More specifically, this aspect of the invention provides a method for optimizing replacement of stacked vias within an integrated circuit design. The invention first locates stacked vias by determining which vias are positioned above or below vias in adjacent wiring levels of the integrated circuit design (using a shapes-processing program). Next, the invention draws marker shapes on or adjacent to the stacked vias in a first direction and uses an optimizer to simultaneously expand all of the marker shapes in the first direction for a predetermined length or until the marker shapes reach the limits of a ground rule. During the expanding, different marker shapes will be expanded to different lengths. Then, the invention determines which of the marker shapes were expanded sufficiently to form a valid replacement via to produce a first set of potential replacement vias. The marker shapes that could not be expanded sufficiently to form a valid replacement via are then eliminated. The foregoing process is repeated in a second direction perpendicular to the first direction to produce a second set of potential replacement vias. The invention replaces the stacked vias with the first set of potential replacement vias and the second set of potential replacement vias by removing the stacked vias from the integrated circuit design and adding the first set of potential replacement vias and the second set of potential replacement vias to the integrated circuit design.

The processes of locating the stacked vias, drawing the marker shapes, and determining which of the marker shapes were expanded sufficiently are performed using a shapes-processing program. The process of expanding the marker shapes is performed using a minimum perturbation layout-migration tool based on augmented ground rules. The augmented ground rules direct the layout-migration tool how to modify the marker shapes to reveal when space is available to continue the expanding of the marker shapes.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
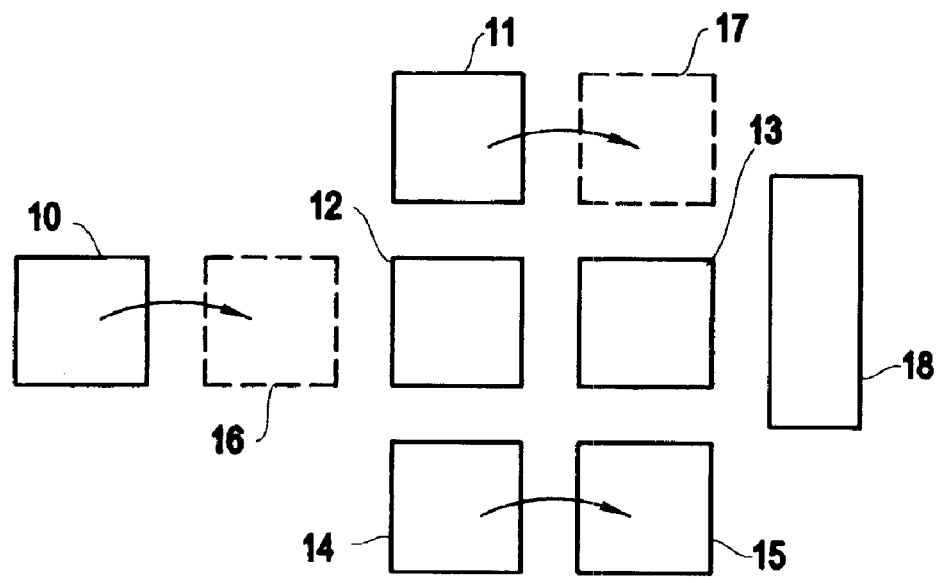
FIG. 1 is a schematic diagram of the vias within an integrated circuit design and potential redundant vias.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention in detail.

Specific embodiments of the invention will now be further described by the following, nonlimiting examples which will serve to illustrate in some detail various features of significance. The examples are intended merely to facilitate an understanding of ways in which the invention may be practiced and to further enable those of skill in the art to practice the invention. Accordingly, the examples should not be construed as limiting the scope of the invention.

The invention optimizes the addition of redundant vias to an existing integrated circuit design by first identifying potential locations for redundant vias (using marker shapes and expanding the marker shapes to the extent permitted by the design ground rules). Then, the invention selects from these potential redundant vias so as to optimize the design by creating the greatest number of redundant vias.

The invention processes the marker shapes one direction at a time (e.g., horizontal first and then vertical). For each direction, the invention first uses a shapes-processing program to find vias of interest (either vias that should be made redundant or sets of vias that should be further spaced apart). The shapes-processing program then draws special "marker shapes" around and near these target vias. Next, a "minimum-perturbation" layout-migration tool (see U.S. Pat. Nos. 6,189,132 and 5,636,132, both of which are fully incorporated herein by reference, for a fuller description) uses a set of special "augmented ground rules" to manipulate these marker shapes by moving and stretching them. These special augmented ground rules encode the manufacturing ground rules for the technology and also direct the layout-migration tool how to modify the marker shapes to reveal when there is space available to perform the desired action (either adding a new redundant via or moving an existing via away from another one). The invention then uses the shapes-processing program to measure which of the marker shapes were able to assume the correct width or length.

Finally, the invention uses a layout editor to read the positions of these successfully modified marker shapes and then to update the original layout accordingly, either by adding new redundant vias or by moving existing vias. All intermediate marker shapes that did not result in additional vias are removed from the layout. After performing the foregoing processing in one direction, (e.g., vertical) the invention then repeats this same set of steps in the other direction (e.g., horizontal), taking into account the processing results for the first direction.

The use of an optimization-driven layout-migration tool allows the application to do complex tradeoffs between different possible alterations to the layout. This provides better results than analogous purely shapes-driven tools, which pursue a naive "look north, look south, look east, look west" strategy. This naive strategy is locally greedy; each via is considered one at a time. The inventive approach is much simpler to implement because the invention instead treats the task in the framework of an optimization problem (i.e., the invention simultaneously considers a set of vias, then obtains the better results). In certain manufacturing technologies, the ground rules governing vias or contacts can be elaborate and can involve several different manufacturing layers. The layout-migration tool is designed specifically to make complicated trade-offs among shapes on several different layers.

Referring now to the drawings, FIG. 1 illustrates a number of existing vias as they appear in an exemplary circuit design. More specifically, items 10–14 represent original vias, item 15 represents a previously established redundant via of via 14, and items 16 and 17 represent redundant vias that would be placed by a "greedy" design modification. Item 18 represents a shape (e.g., metal shape) that prevents redundant vias from being formed to the right of via 13. Such a greedy design modification system looks at each via individually and creates a redundant via without considering the relationships of other neighboring vias. In the example shown in FIG. 1, the design modification system simply places redundant vias to the right of the existing vias. Therefore, redundant via 16 is a redundant via for via 10. Similarly, redundant via 17 is a redundant via for via 11. However, because of the placement of redundant vias 16 and 17 and because of the metal shape 18, redundant vias could not be formed for vias 12 and 13. This situation is contrasted with the inventive optimized via placement methodology, which is shown in FIG. 2.

Figure 2:
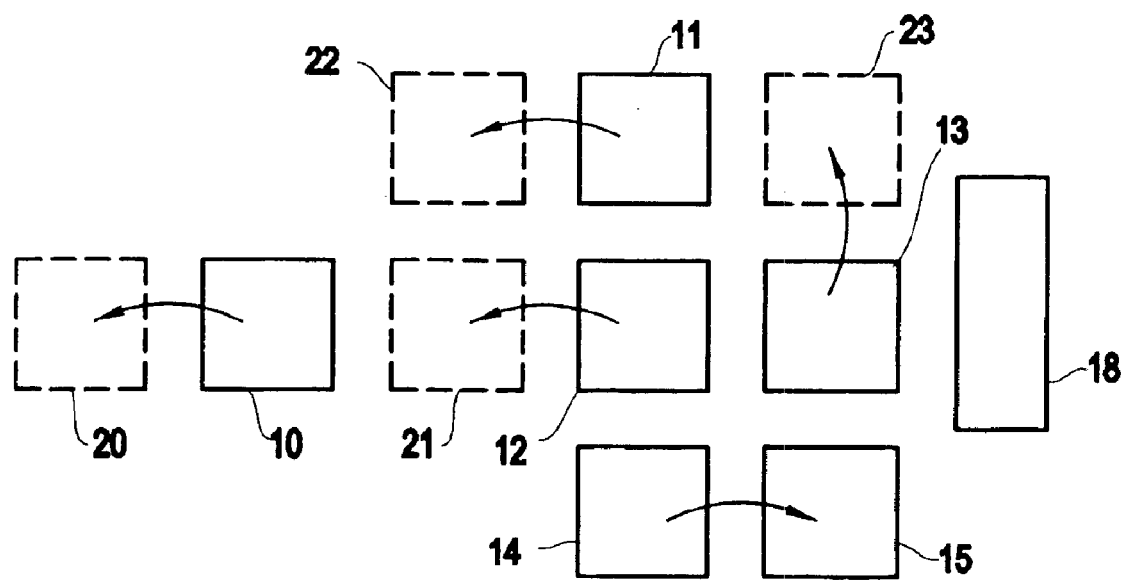
FIG. 2 is a schematic diagram of the vias within an integrated circuit design and potential redundant vias.

More specifically, the inventive methodology is used to form redundant vias 20–23 in FIG. 2, which is substantially more redundant vias than were formed with the methodology applied in FIG. 1. As explained above, the invention first looks in one direction to determine multiple possible locations for redundant vias. Given the possible locations for redundant vias, the optimizer looks at the design as a whole and selects the appropriate via locations to maximize the number of redundant vias added to the design. With the invention, when first looking in the horizontal direction, instead of forming redundant via 16 to the right of via 10, the invention forms redundant via 20 to the left of via 10. This creates space for redundant via 21 which is a redundant via of via 12. Similarly, the invention forms redundant via 23 above of its corresponding original via 13, when performing the same processing in the vertical direction. Therefore, by considering potential vias, and by using an optimizer, the invention is able to automatically add a substantially larger number of vias when compared to the greedy methodology shown in FIG. 1.

Figure 3A:
FIG. 3 is a schematic diagram illustrating the expanding of marker shapes.
Figure 3B:
Figure 3C:

FIGS. 3A–3B illustrate expanding marker shapes. More specifically, item 30 represents an original via and item 31 represents a marker shape that is added to the design. Progressively through FIGS. 3B and 3C, the marker shape 31 is expanded away from the via 30. This expansion process is continued until the marker shape 31 reaches the limits of the ground rules of the design or when shape 31 is a sufficient distance from via 30. Therefore, the expansion process would stop moving marker shapes 31 when additional movement would cause marker shapes 31 to be too close to another shape as controlled by the ground rules or when a via placed at the same location as 31 would be legal. In addition, marker shapes representing the layout levels connected to via 30 are also expanded as shape 31 moves, and the ground rules governing the levels that these vias represent are taken into account. Alternatively, a maximum expansion distance (or a maximum time period for the optimization for expansion) could be established.

While all marker shapes are expanded simultaneously, the amount of expansion will vary between marker shapes depending upon the proximity of other shapes. Some marker shapes will not be able to expand sufficiently to create even the minimum-sized redundant-via structure. To the contrary, other marker shapes may be expanded to easily allow a redundant via to be formed.

In addition, as also mentioned above, the marker shapes are not subject to the same ground rules to which the original vias are subject. To the contrary, these special augmented ground rules are different. These augmented ground rules encode all of the ground rules for the existing layers in the design as well as for the interaction of the marker shapes with the existing layers. For example, a marker shape that will represent a given level X in the technology must have all the ground rules for the level X. Suppose that this marker shape is on level X_MK. Then, the augmented ground rules require us to specify interactions between X and X, X and X_MK, and X_MK and X_MK.

Figure 4:
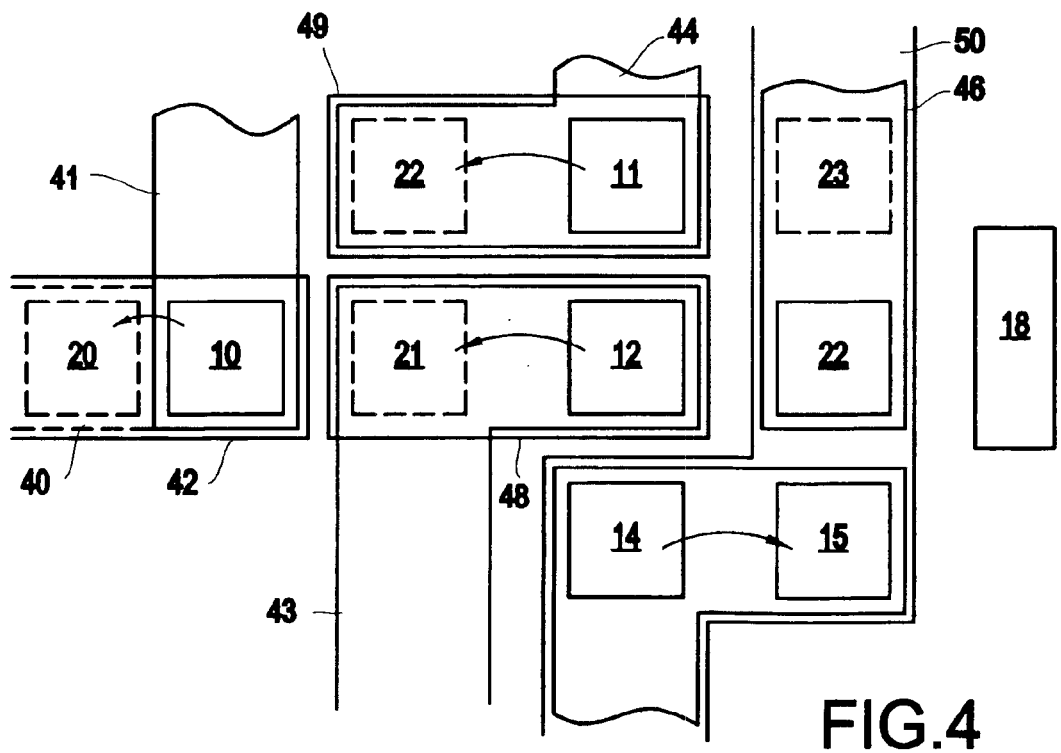
FIG. 4 is a schematic diagram of the vias and wiring lines within an integrated circuit design.

FIG. 4 illustrates the same original vias 10–14 and the same redundant vias 15 and 20–23 that are shown above with respect to FIG. 2. However, FIG. 4 also illustrates wires 41–44, 46, and 47 that are connected to the original vias and redundant vias. More specifically, two different wiring shapes 41 and 42 (which are on different levels of the multi-leveled ceramic substrate) are originally connected by via 10. With the addition of redundant via 20, an additional metal shape 40 is created and added to wire 41 to allow redundant via 20 to provide a redundant connection between wire 41 and 42. The shapes-processing program adds the additional metal shapes. Similarly, original via 12 connects metal wire 43 with metal shape 48 (which are not on the same level of the multi-level ceramic substrate). Redundant via 21 provides a redundant connection between those same conductive elements. Original via 11 forms a connection between shape 49 and wire 44. Original via 13 connects wire 46 to wire 50 and original via 14 connects wire 47 to wire 50. Redundant vias 23 and 15 provide redundant contacts between those same connections. Alternatively, the shapes-processing program can place an instance of an existing redundant via model containing all the necessary structures to form the redundant via connection between the two metal layers in question.

Figure 5:
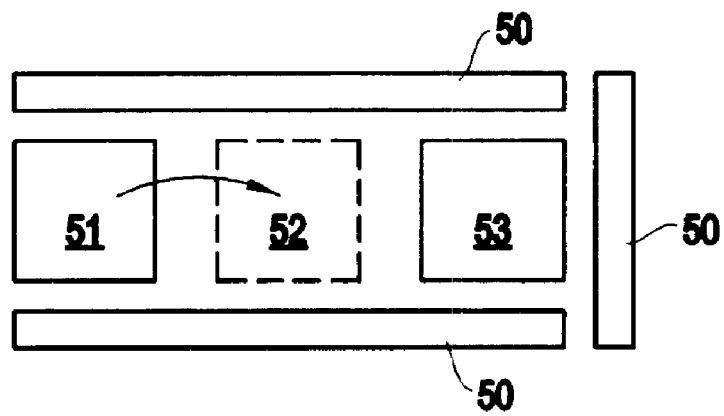
FIG. 5 is a schematic diagram of the vias within an integrated circuit design and potential redundant vias.
Figure 6:
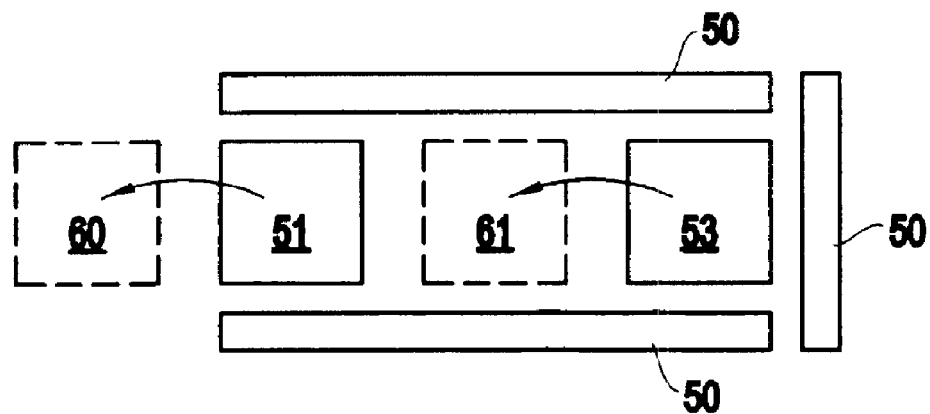
FIG. 6 is a schematic diagram of the vias within an integrated circuit design and potential redundant vias.

FIGS. 5 and 6 illustrate an additional example of the invention working only in the horizontal direction. More specifically, FIG. 5 shows metal shapes 50, vias 51 and 53 and redundant via 52 placed by a "greedy" naïve placement mechanism. To the contrary, as shown in FIG. 6, the optimizer used with the invention is able to form a redundant via 60, 61 for each of the original vias 51, 53. To the contrary, the mechanism used in FIG. 5 only produces a redundant via 52 for via 51. Therefore, once again, the invention optimizes the placement of redundant vias to allow more redundant vias to be added to the circuit.

When selecting between potential redundant vias, the optimizer not only considers surrounding vias and metal shapes, but also considers metal shapes and vias on underlying and overlying layers within the multi-layer structure. Therefore, for each axis (horizontal, vertical), the optimizer maximizes the number of redundant vias within the entire multi-layer structure (as opposed to maximizing the number of redundant vias between just two levels).

Figure 7:
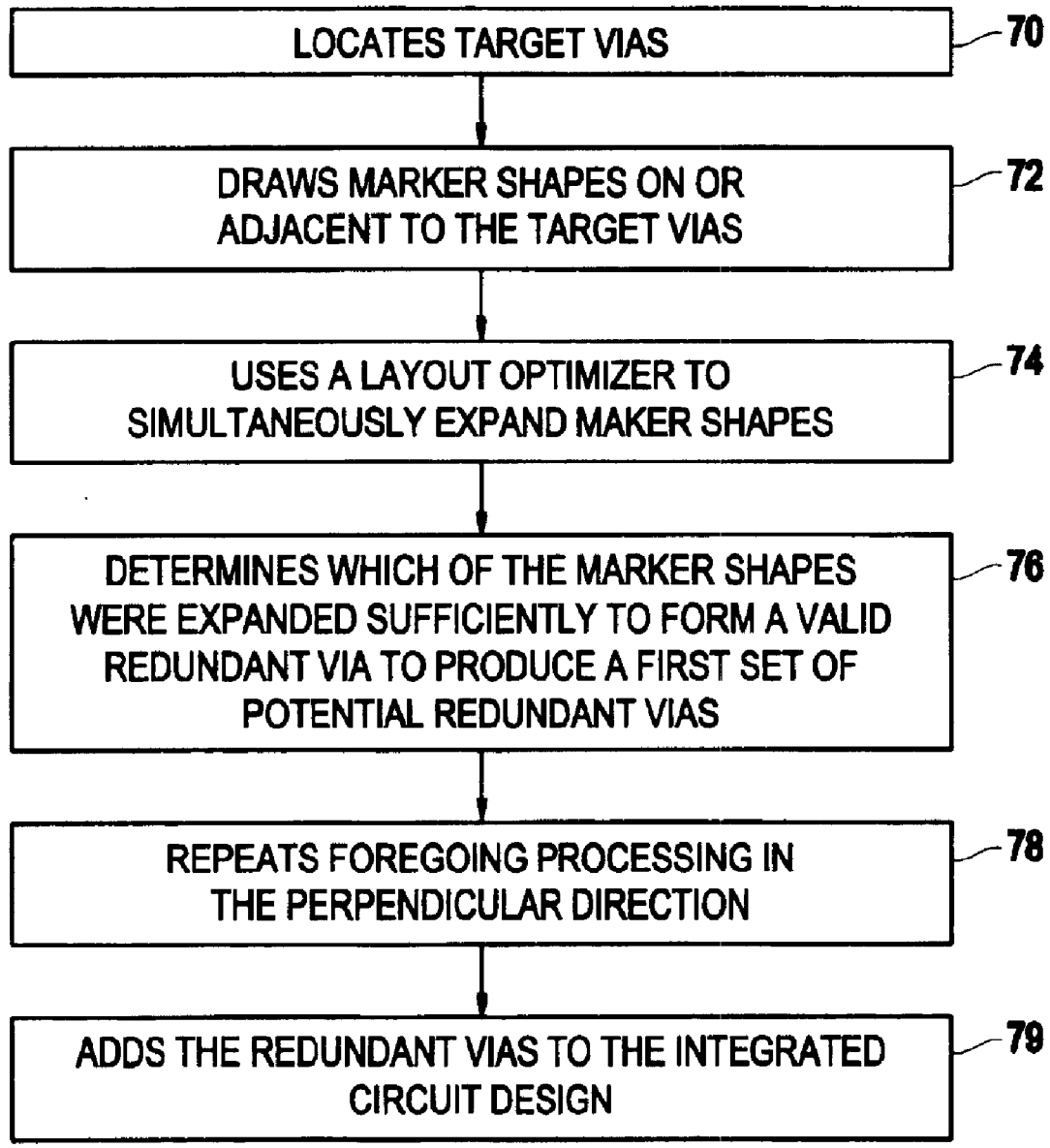
FIG. 7 is a flow diagram illustrating a method of the invention.

As shown in the flowchart in FIG. 7, the invention first locates target vias by determining which vias do not have a redundant via (item 70). Then, the invention draws marker shapes on, or adjacent to, the target vias (item 72). The marker shapes are first only drawn in a horizontal direction from each of the target vias. Next, the invention uses a layout optimizer to simultaneously expand marker (item 74). During the expanding, different marker shapes will be expanded to different lengths. The invention determines which of the marker shapes were expanded sufficiently to form a valid redundant via to produce a first set of potential redundant vias (item 76) and the invention eliminates marker shapes that could not be expanded sufficiently to form a valid redundant via. The invention repeats the foregoing processing in the perpendicular (e.g., vertical) direction (item 78). The invention then adds the redundant vias to the integrated circuit design (item 79).

Figure 8:
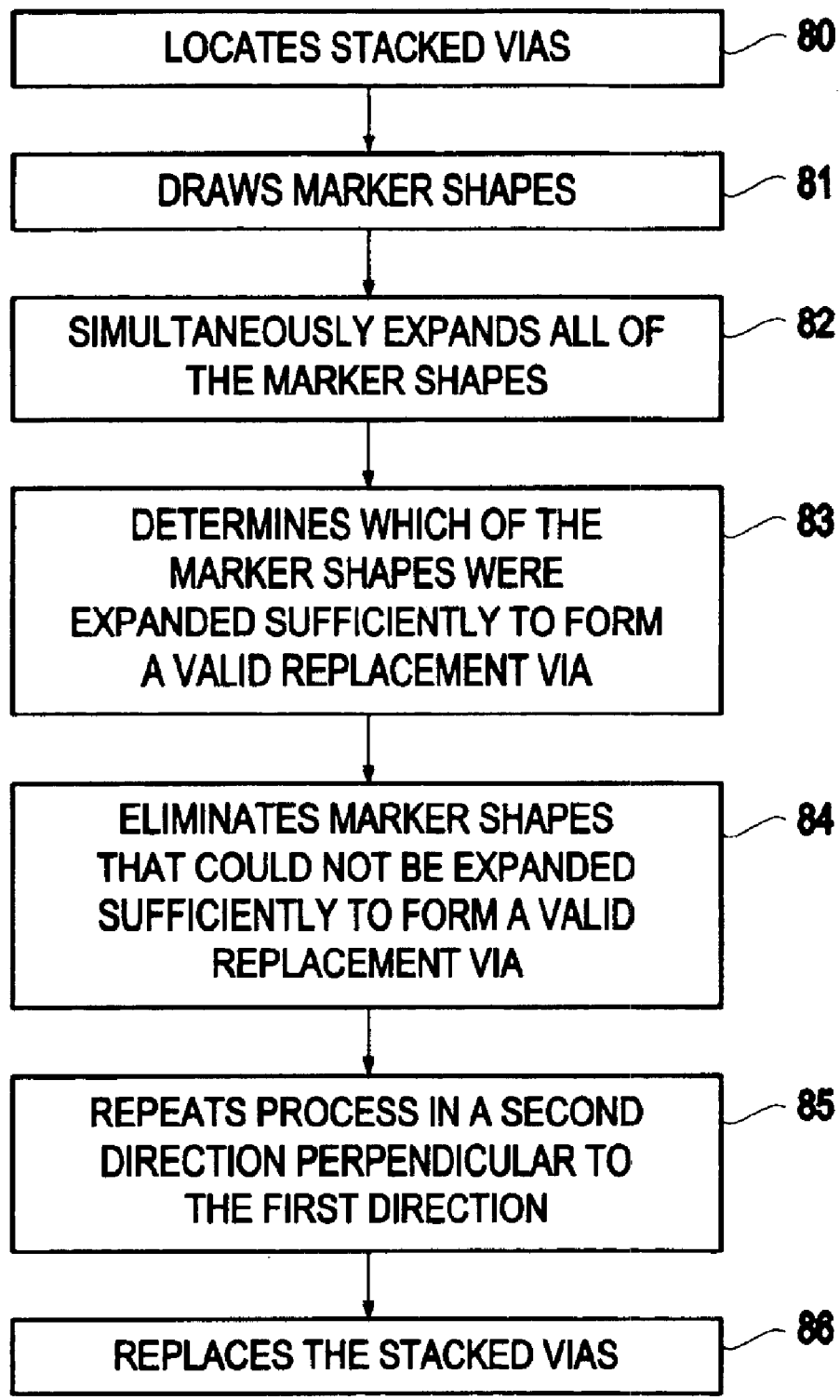
FIG. 8 is a flow diagram illustrating a method of the invention.
Figure 9:
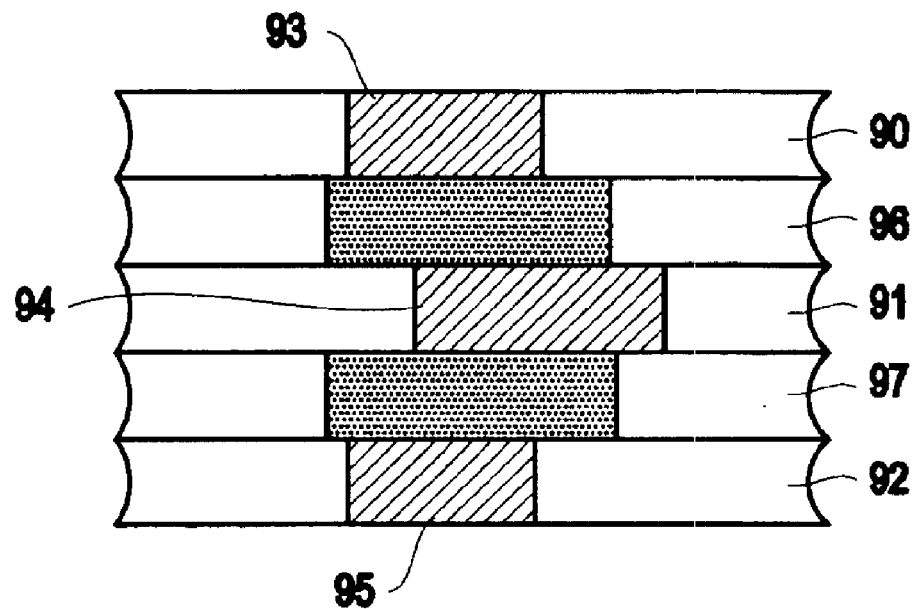
FIG. 9 is a schematic diagram of the vias and wiring lines within an integrated circuit design.
Figure 10:
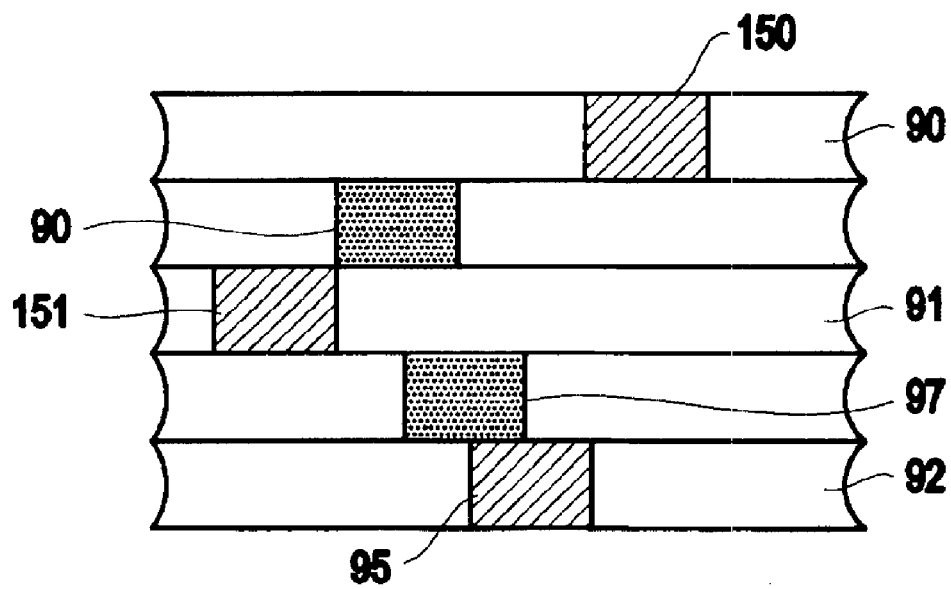
FIG. 10 is a schematic diagram of the vias and wiring lines within an integrated circuit design.

The invention eliminates stacked vias using a similar technique. Instead of just adding a redundant via, the invention adds a redundant via and then removes the original via. In this way, vias on level Vx and Vx+1 will then no longer overlay each other. More specifically, as shown in the flowchart in FIG. 8, this aspect of the invention provides a method for optimizing replacement of stacked vias within an integrated circuit design. In item 80, the invention first locates stacked vias by determining which vias are positioned above or below vias in adjacent wiring levels of the integrated circuit design (using a shapes-processing program). For example, via 93 is positioned directly above via 94 which, in turn is positioned directly above via 95 within the three wiring layers 90–92 that are shown in cross-section in FIG. 9. Layers 96 and 97 are metal layers. As mentioned, the shapes processing program identifies these vias 93–95 as stacked vias. The invention replaces some or all of the stacked vias with replacement vias. FIG. 10 illustrates that via 150 replaces via 93 and via 151 replaces via 94. The processing described above is used to determine how far and where the vias can be moved and reference is made to the previous discussion for such detailed explanation. Therefore, this process is similar to the process of adding redundant vias discussed above, except that the redundant via now replaces the original via as the original via is eliminated from the design.

Next, in item 81, the invention draws marker shapes on or adjacent to the stacked vias in a first direction and uses an optimizer to simultaneously expand all of the marker shapes (item 82) in the first direction for a predetermined length or until the marker shapes reach the limits of a ground rule. During the expanding, different marker shapes will be expanded to different lengths. Then, the invention determines which of the marker shapes were expanded sufficiently to form a valid replacement via (item 83) to produce a first set of potential replacement vias. The marker shapes that could not be expanded sufficiently to form a valid replacement via are then eliminated (item 84). The foregoing process is repeated in a second direction perpendicular to the first direction (item 85) to produce a second set of potential replacement vias. The invention replaces the stacked vias (item 86) with the first set of potential replacement vias and the second set of potential replacement vias by removing the stacked vias from the integrated circuit design and adding the first set of potential replacement vias and the second set of potential replacement vias to the integrated circuit design.

Figure 11:
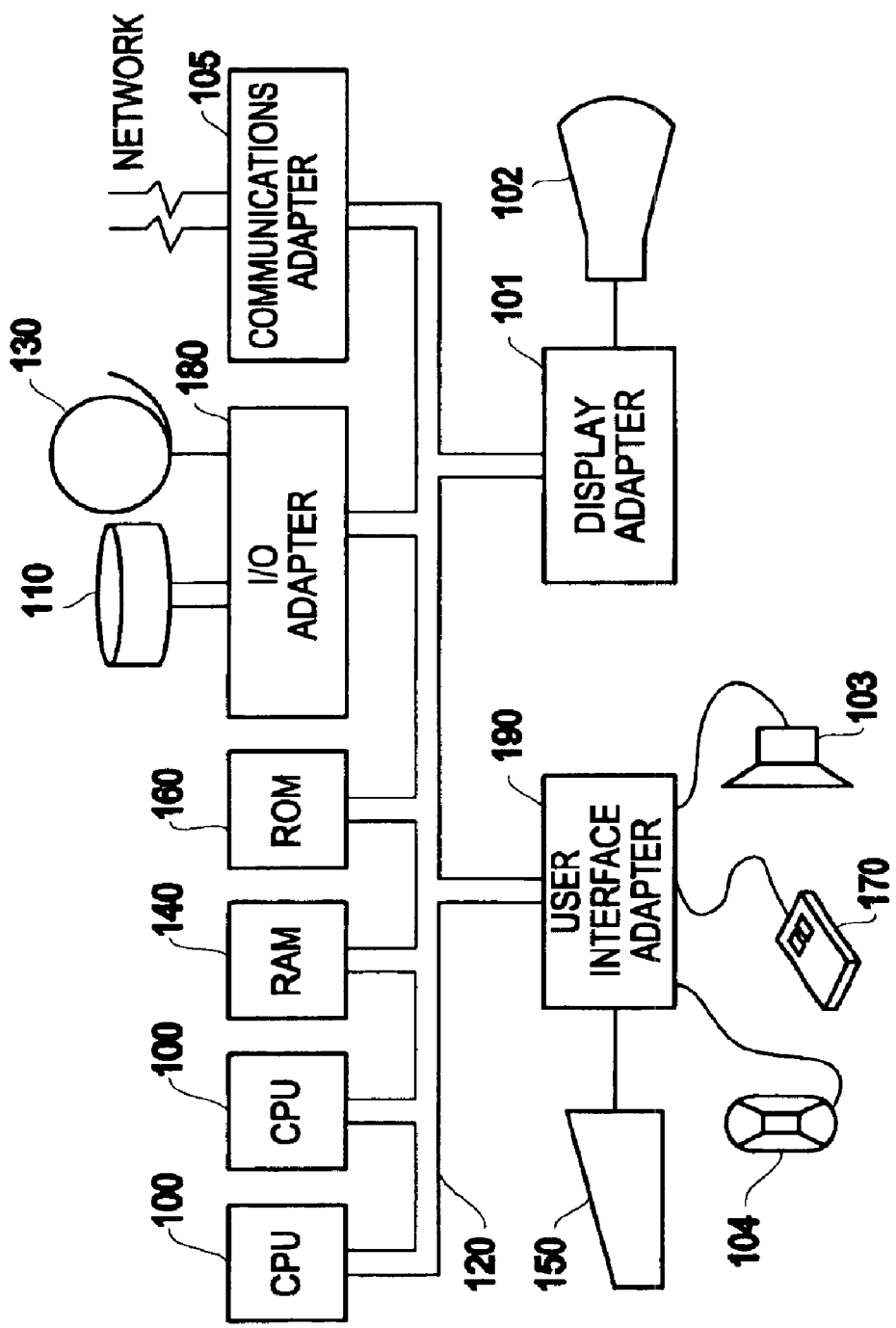
FIG. 11 is a system embodiment of the invention.

A representative hardware environment for practicing the present invention is depicted in FIG. 11, which illustrates a typical hardware configuration of an information handling/computer system in accordance with the subject invention, having at least one processor or central processing unit (CPU) 100. CPUs 100 are interconnected via system bus 120 to random access memory (RAM) 140, read-only memory (ROM) 160, an input/output (I/O) adapter 180 for connecting peripheral devices, such as disk units 110 and tape drives 130, to bus 120, user interface adapter 190 for connecting keyboard 150, mouse 170, speaker 103, microphone 104, and/or other user interface devices such as touch screen device (not shown) to bus 120, communication adapter 105 for connecting the information handling system to a data processing network, and display adapter 101 for connecting bus 120 to display device 102. A program storage device readable by the disk or tape units is used to load the instructions, which operate the invention also loaded onto the computer system.

The processes of locating the stacked vias, drawing the marker shapes, and determining which of the marker shapes were expanded sufficiently are performed using a shapes-processing program. The process of expanding the marker shapes is performed using a minimum perturbation layout-migration tool based on augmented ground rules. The augmented ground rules direct the layout-migration tool how to modify the marker shapes to reveal when space is available to continue the expanding of the marker shapes.

The use of an optimization-driven layout-migration tool allows the invention to do complex tradeoffs between different possible alterations to the layout. This provides better results than analogous purely shapes-driven tools, which pursue a naive "look north, look south, look east, look west" strategy. This naïve strategy is locally greedy; each via is considered one at a time. The invention is much simpler to implement because the invention instead treats the task in the framework of an optimization problem (i.e., the invention simultaneously considers a set of vias, then the results obtains better results). In certain manufacturing technologies, the ground rules governing vias or contacts can be elaborate and can involve several different manufacturing layers. The layout-migration tool is designed specifically to make complicated trade-offs among shapes on several different layers.

While the invention has been described in terms of preferred embodiments, those skilled in the art will recognize that the invention can be practiced with modification within the spirit and scope of the appended claims.

What is claimed is:

1. A method for optimizing placement of redundant vias within an integrated circuit design, said method comprising:
   a) locating target vias;
   b) drawing marker shapes adjacent to said target vias in a first direction;
   c) using an optimizer to simultaneously expand all of said marker shapes either in said first direction, wherein during said expanding, different marker shapes will be expanded to different lengths;
   d) determining which of said marker shapes were expanded sufficiently to form a valid redundant via to produce a first set of potential redundant vias;
   e) eliminating marker shapes that could not be expanded sufficiently to form a valid redundant via; and
   f) repeating steps b–e in a second direction perpendicular to said first direction to produce a second set of potential redundant vias.

2. The method in claim 1, wherein said locating of said target vias and said drawing of said marker shapes is performed using a shapes-processing program.

3. The method in claim 1, wherein said expanding of said marker shapes is performed using a minimum perturbation layout-migration tool based on augmented ground rules.

4. The method in claim 3, wherein said augmented ground rules direct said layout-migration tool how to modify said marker shapes to reveal when space is available to continue said expanding of said marker shapes.

5. The method in claim 1, wherein said determining which of said marker shapes were expanded sufficiently is performed using a shapes-processing program.

6. The method in claim 1, wherein said integrated circuit design complies with design ground rules prior to step a.

7. The method in claim 1, further comprising after step f, adding redundant vias to said integrated circuit design according to output produced by said optimizer.

8. A method for optimizing placement of redundant vias within an integrated circuit design, said method comprising:
   a) locating target vias by determining which vias do not have a redundant via;
   b) drawing marker shapes adjacent said target vias, wherein said marker shapes are drawn in a first direction;
   c) using an optimizer to simultaneously expand all of said marker shapes in said first direction for a predetermined length or until said marker shapes reach the limits of a ground rule, wherein during said expanding, different marker shapes will be expanded to different lengths;
   d) determining which of said marker shapes were expanded sufficiently to form a valid redundant via to produce a first set of potential redundant vias;
   e) eliminating marker shapes that could not be expanded sufficiently to form a valid redundant via; and
   f) repeating steps b–e in a second direction perpendicular to said first direction to produce a second set of potential redundant vias.

9. The method in claim 8, wherein said locating of said target vias and said drawing of said marker shapes is performed using a shapes-processing program.

10. The method in claim 8, wherein said expanding of said marker shapes is performed using a minimum perturbation layout-migration tool based on augmented ground rules.

11. The method in claim 10, wherein said augmented ground rules direct said layout-migration tool how to modify said marker shapes to reveal when space is available to continue said expanding of said marker shapes.

12. The method in claim 8, wherein said determining which of said marker shapes were expanded sufficiently is performed using a shapes-processing program.

13. The method in claim 8, wherein said integrated circuit design complies with design ground rules prior to step a.

14. The method in claim 8, further comprising after step f, adding redundant vias to said integrated circuit design according to output produced by said optimizer.

15. A method for optimizing replacement of stacked vias within an integrated circuit design, said method comprising:
   a) locating stacked vias by determining which vias are positioned above or below vias in adjacent wiring levels of said integrated circuit design;
   b) drawing marker shapes on or adjacent to said stacked vias in a first direction;
   c) using an optimizer to simultaneously expand all of said marker shapes in said first direction for a predetermined length or until said marker shapes reach the limits of a ground rule, wherein during said expanding, different marker shapes will be expanded to different lengths;
   d) determining which of said marker shapes were expanded sufficiently to form a valid replacement via to produce a first set of potential replacement vias;

e) eliminating marker shapes that could not be expanded sufficiently to form a valid replacement via;

f) repeating steps b–e in a second direction perpendicular to said first direction to produce a second set of potential replacement vias; and g) replacing said stacked vias with said first set of potential replacement vias and said second set of potential replacement vias by removing said stacked vias from said integrated circuit design and adding said first set of potential replacement vias and said second set of potential replacement vias to said integrated circuit design.

16. The method in claim 15, wherein said locating of said stacked vias and said drawing of said marker shapes is performed using a shapes-processing program.

17. The method in claim 15, wherein said expanding of said marker shapes is performed using a minimum perturbation layout-migration tool based on augmented ground rules.

18. The method in claim 15, wherein said augmented ground rules direct said layout-migration tool how to modify said marker shapes to reveal when space is available to continue said expanding of said marker shapes.

19. The method in claim 15, wherein said determining which of said marker shapes were expanded sufficiently is performed using a shapes-processing program.

20. The method in claim 15, wherein said integrated circuit design complies with design ground rules prior to step a.

21. A program storage device readable by machine, tangibly embodying a program of instructions executable by the machine to perform a method for optimizing placement of redundant vias within an integrated circuit design, said method comprising:

a) locating target vias;

b) drawing marker shapes adjacent to said target vias in a first direction;

c) using an optimizer to simultaneously expand all of said marker shapes either in said first direction, wherein during said expanding, different marker shapes will be expanded to different lengths;

d) determining which of said marker shapes were expanded sufficiently to form a valid redundant via to produce a first set of potential redundant vias;

e) eliminating marker shapes that could not be expanded sufficiently to form a valid redundant via; and f) repeating steps b–e in a second direction perpendicular to said first direction to produce a second set of potential redundant vias.

22. The program storage device in claim 21, wherein said locating of said target vias and said drawing of said marker shapes is performed using a shapes-processing program.

23. The program storage device in claim 21, wherein said expanding of said marker shapes is performed using a minimum perturbation layout-migration tool based on augmented ground rules.

24. The program storage device in claim 23, wherein said augmented ground rules direct said layout-migration tool how to modify said marker shapes to reveal when space is available to continue said expanding of said marker shapes.

25. The program storage device in claim 21, wherein said determining which of said marker shapes were expanded sufficiently is performed using a shapes-processing program.

26. The program storage device in claim 21, wherein said integrated circuit design complies with design ground rules prior to step a.

27. The program storage device in claim 21, wherein said method further comprises after step f, adding redundant vias to said integrated circuit design according to output produced by said optimizer.

* * * * *